United States Patent
Ward

(10) Patent No.: US 7,132,696 B2
(45) Date of Patent: Nov. 7, 2006

(54) INTERMESHED GUARD BANDS FOR MULTIPLE VOLTAGE SUPPLY STRUCTURES ON AN INTEGRATED CIRCUIT, AND METHODS OF MAKING SAME

(75) Inventor: Joseph A. Ward, Swindon (GB)

(73) Assignee: Micron Technology, Inc., Boise, ID (US)

( * ) Notice: Subject to any disclaimer, the term of this patent is extended or adjusted under 35 U.S.C. 154(b) by 436 days.

(21) Appl. No.: 10/231,766

(22) Filed: Aug. 28, 2002

(65) Prior Publication Data

US 2004/0041227 A1    Mar. 4, 2004

(51) Int. Cl.
    *H01L 31/111*    (2006.01)
(52) U.S. Cl. .................. 257/127; 257/170; 257/409
(58) Field of Classification Search ............... 257/127, 257/170, 207, 208, 409, 452, 483, 484, 485, 257/609, 691, 698; 438/48, 140, 454, 570
    See application file for complete search history.

(56) References Cited

U.S. PATENT DOCUMENTS

| | | | | |
|---|---|---|---|---|
| 4,106,953 A | * | 8/1978 | Onodera | 438/379 |
| 4,302,875 A | | 12/1981 | Satou et al. | 29/571 |
| 4,672,584 A | | 6/1987 | Tsuji et al. | 365/226 |
| 4,866,508 A | * | 9/1989 | Eichelberger et al. | 326/41 |
| 4,910,839 A | * | 3/1990 | Wright | 29/25.35 |
| 5,060,037 A | * | 10/1991 | Rountree | 257/357 |
| 5,126,816 A | | 6/1992 | Reczek et al. | 357/42 |
| 5,338,986 A | | 8/1994 | Kurimoto | 307/303.2 |
| 5,597,758 A | * | 1/1997 | Heim et al. | 438/527 |
| 5,689,133 A | * | 11/1997 | Li et al. | 257/361 |
| 5,895,940 A | | 4/1999 | Kim | 257/173 |
| 6,009,034 A | | 12/1999 | Manning | 365/226 |
| 6,052,322 A | | 4/2000 | Beigel et al. | 365/201 |
| 6,078,085 A | | 6/2000 | Suzuki | 257/369 |
| 6,101,150 A | | 8/2000 | Roohparvar | 365/230.06 |
| 6,111,451 A | | 8/2000 | Imam et al. | 327/343 |
| 6,144,089 A | | 11/2000 | Corisis | 257/691 |
| 6,266,277 B1 | | 7/2001 | Roohparvar | 365/185.18 |
| 6,275,409 B1 | | 8/2001 | Porter et al. | 365/149 |
| 6,285,608 B1 | | 9/2001 | Roohparvar | 365/201 |
| 6,291,280 B1 | | 9/2001 | Rhodes | 438/199 |
| 6,307,802 B1 | | 10/2001 | Manning | 365/226 |
| 6,330,194 B1 | | 12/2001 | Thomann et al. | 365/189.05 |
| 6,337,813 B1 | | 1/2002 | Marr | 365/189.09 |
| 6,424,022 B1 | * | 7/2002 | Wu et al. | 257/665 |
| 6,469,354 B1 | * | 10/2002 | Hirata | 257/358 |
| 6,536,106 B1 | * | 3/2003 | Jackson et al. | 29/872 |
| 6,586,292 B1 | * | 7/2003 | Wu et al. | 438/215 |
| 6,633,071 B1 | * | 10/2003 | Furio | 257/383 |

FOREIGN PATENT DOCUMENTS

JP            09306999          11/1997

* cited by examiner

*Primary Examiner*—Douglas W. Owens
(74) *Attorney, Agent, or Firm*—Williams, Morgan & Amerson, P.C.

(57) ABSTRACT

The present invention is generally directed to intermeshed guard bands for multiple voltage supply regions or structures on an integrated circuit, and methods of making same. In one illustrative embodiment, an integrated circuit is provided that comprises a plurality of voltage supply structures formed above a substrate, the plurality of voltage supply structures being at differing voltage levels, and a guard band comprised of at least one doped region formed in the substrate under each of the plurality of voltage supply regions, each of the guard bands being comprised of a plurality of fingers extending from each end of the guard bands.

83 Claims, 8 Drawing Sheets

US 7,132,696 B2

INTERMESHED GUARD BANDS FOR MULTIPLE VOLTAGE SUPPLY STRUCTURES ON AN INTEGRATED CIRCUIT, AND METHODS OF MAKING SAME

BACKGROUND OF THE INVENTION

1. Field of the Invention

This present invention is generally directed to the field of integrated circuits and semiconductor processing, and, more particularly, to intermeshed guard bands for multiple voltage supply regions or structures on an integrated circuit, and methods of making same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Complementary metal oxide (CMOS) technology is widely used in various integrated circuit products, such as logic circuits, memory circuits, application-specific integrated circuits, etc., due to various performance characteristics associated with CMOS devices, e.g., lower power consumption. In general, CMOS integrated circuits are comprised of P-channel (PMOS) and N-channel (NMOS) transistors which are formed on the same semi-conducting substrate. As a result of such structures, parasitic bipolar transistors (of both the PNP type and the NPN type) are formed in the CMOS integrated circuit. For example, a PNP parasitic transistor is formed where an N-type substrate, which serves as its base, is formed within a P-well, which serves as its collector. The source or drain of a PMOS transistor serves as the emitter of the parasitic PNP transistor. At the same time, an NPN parasitic transistor is possible where the P-well, which serves as the base, is formed within the N-type substrate, which serves as the collector. The source or drain of the NMOS transistor serves as the emitter for the NPN parasitic transistor.

When such a CMOS structure forms an output circuit of an integrated circuit device, a ground voltage ($V_{SS}$) and a power supply voltage ($V_{CC}$) are typically supplied to the sources of the NMOS and PMOS transistors, respectively. The drains of the NMOS and PMOS transistors are used for an output terminal of the output circuit. If the output terminal accidentally receives a triggering voltage which is generally higher than the power supply voltage ($V_{CC}$) or lower than the ground voltage ($V_{SS}$), the parasitic transistors begin to conduct since the junctions between the base and emitter are forward biased. Once both parasitic transistors become conducting, a current continues to flow in a direction from the power supply voltage ($V_{CC}$) to the ground voltage ($V_{SS}$) without any further triggering voltage to the output terminal. This situation is known in the industry as "latch-up." When latch-up occurs, the CMOS circuits are often permanently damaged by the resulting high currents.

In modern CMOS integrated circuits, the most likely source for the undesirable triggering voltage that may cause latch-up are the pad drivers, where large voltage transients and large currents are present. FIG. 1A is a schematic depiction of various I/O (input/output) voltage supply regions that may be found on a modern integrated circuit 10 employing CMOS technology. As shown therein, the integrated circuit 10 is generally comprised of a core region 12 wherein the various circuits, comprised of PMOS and NMOS transistors, may be formed. In general, there are four types of power rings depicted in FIG. 1A—VDD, GND, VDDIO and GNDIO. Both VDD (14) and GND (16) are connected to the core logic power supply. VDDIO and GNDIO are the supply voltages to the I/O buffers, which drive heavy loads. In the particular embodiment depicted in FIG. 1A, three cuts 18A, 18B, 18C are made in the VDDIO and GNDIO rings to thereby define three separate power supply structures or power domains 20A (VDDIO1), 20B (VDDIO2) and 20C (VDDIO3). Separation of the power supply structures enables chip designers to isolate the various power domains and/or to use different voltage levels for different input/output buffers. As will be understood by those skilled in the art, the depiction of three voltage domains in FIG. 1A is by way of example only, as there may be more or fewer voltage domains on the integrated circuit device, and the magnitudes of the voltages of the various power domains may vary depending upon the particular integrated circuit.

Generally, in an effort to avoid or reduce the possibility of latch-up, a doped region or guard band 13 is formed in the substrate 17 under each of the various power supply structures, e.g., VDDIO1, VDDIO2 and VDDIO3. FIGS. 1B and 1C are, respectively, a plan view and a cross-sectional view of an illustrative power supply structure 10, e.g., VDDIO3, and a simplified version of such a doped region or guard band 13. The illustrative guard band 13 is depicted in FIGS. 1B and 1C is a relatively deep N-well doped region that is formed by implanting the appropriate dopant atoms into the substrate 17. A contact 15 is provided to the guard band 13 so that a voltage may be applied to the guard band 13. FIG. 1D is a cross-sectional view of a guard band 13 comprised of multiple doped regions formed in the substrate 17. More specifically, in the illustrative example depicted in FIG. 1D, the guard band 13 is comprised of, in one embodiment, an $N^+$ active region 13A, an N-well 13B and a deep buried N-well 13C. A layer of insulating material 10A is positioned between the voltage supply structure 10 and the substrate 17. Unfortunately, using such prior art structures, the areas defined by each of the cuts 18A–C in the voltage supply structures still define possible paths for triggering currents and voltages that may enter the core region 12 and cause the latch-up phenomenon to occur.

The present invention is directed to a device and various methods that may solve, or at least reduce, some or all of the aforementioned problems.

SUMMARY OF THE INVENTION

The present invention is generally directed to intermeshed guard bands for multiple voltage supply regions or structures on an integrated circuit, and methods of making same. In one illustrative embodiment, an integrated circuit is provided that comprises a plurality of voltage supply structures formed above a substrate, the plurality of voltage supply structures being at differing voltage levels, and a guard band comprised of at least one doped region formed in the substrate under each of the plurality of voltage supply regions, each of the guard bands being comprised of a plurality of fingers extending from each end of the guard bands.

In another illustrative embodiment, an integrated circuit is provided that comprises a plurality of voltage supply structures formed above a substrate, the plurality of voltage supply structures being at differing voltage levels, and a guard band comprised of at least one doped region formed in the substrate under each of the voltage supply regions, each of the guard bands being comprised of a plurality of fingers extending from each end of the guard bands, wherein the plurality of fingers on a first of the guard bands nests with the plurality of fingers on a second guard band positioned proximate the first guard band.

BRIEF DESCRIPTION OF THE DRAWINGS

The invention may be understood by reference to the following description taken in conjunction with the accompanying drawings, in which like reference numerals identify like elements, and in which.

Figure 1A:
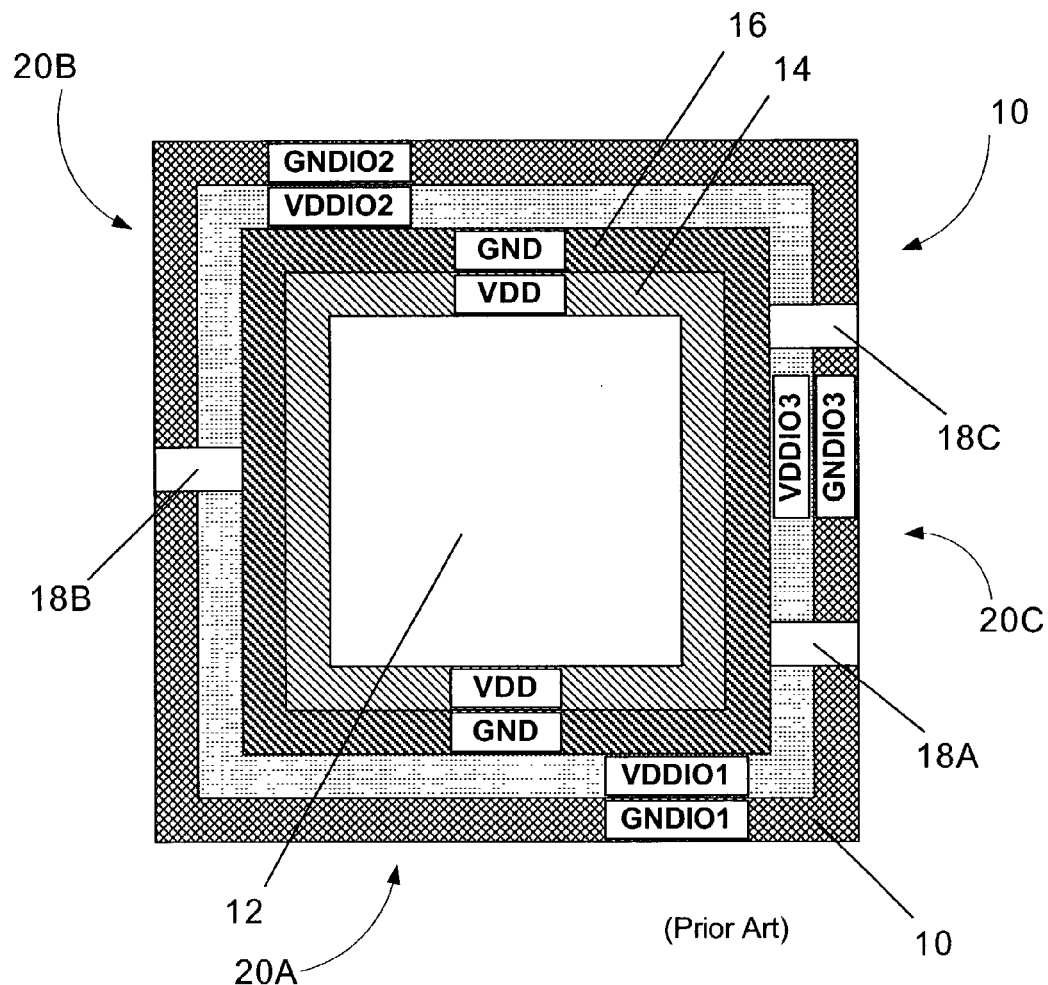
FIGS. 1A–1D are plan and cross-sectional schematic depictions of a prior art power grid layout on an integrated circuit device.
Figure 1B:
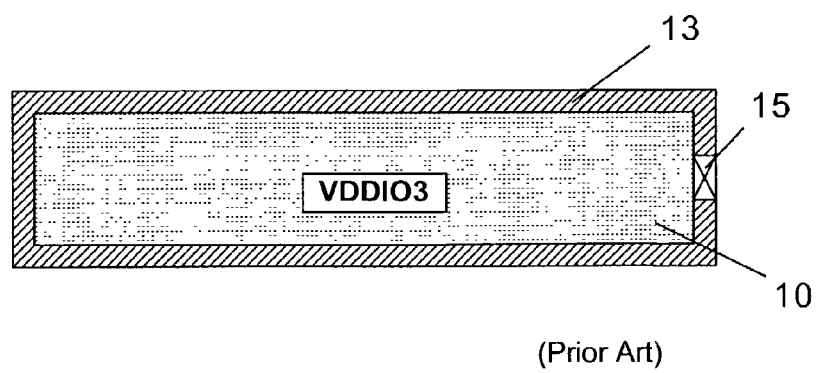
Figure 1C:
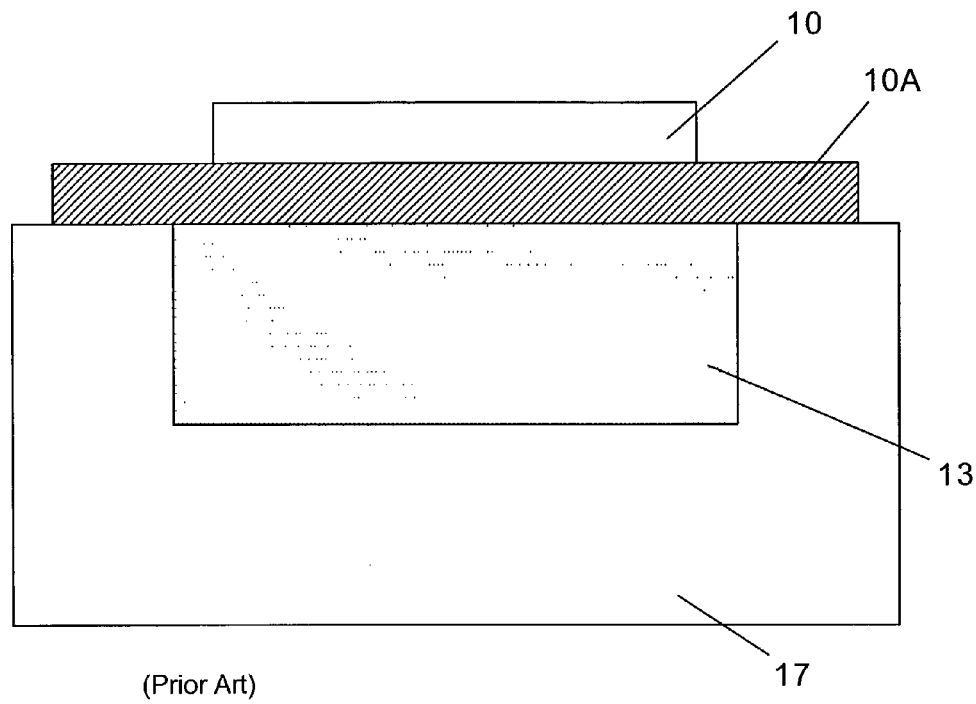
Figure 1D:
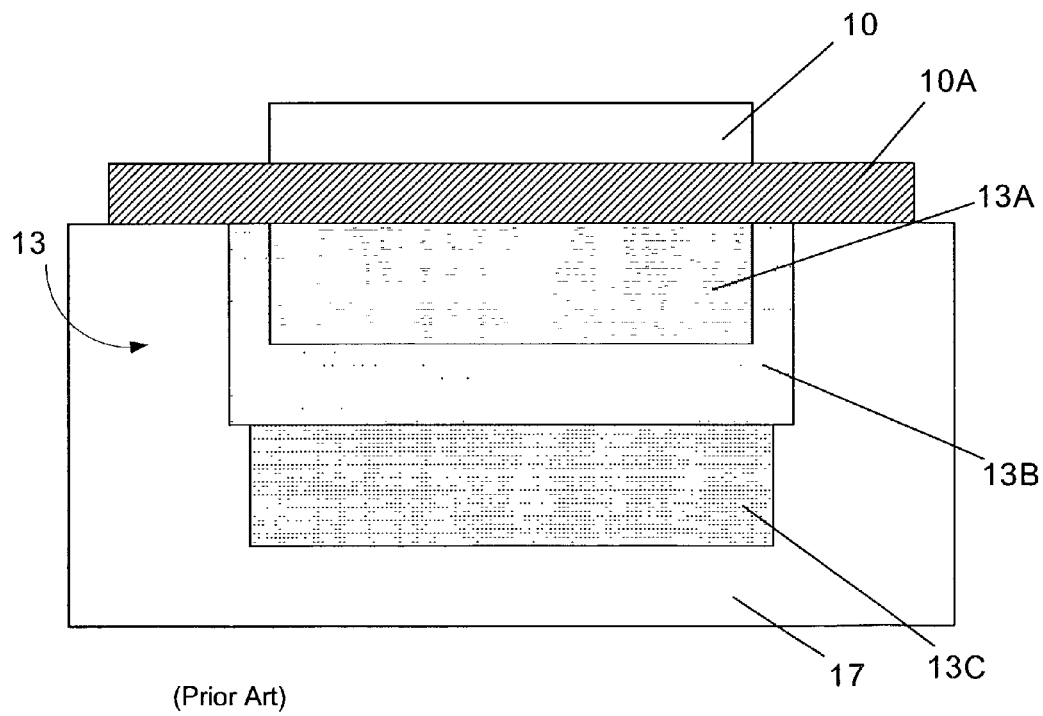

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
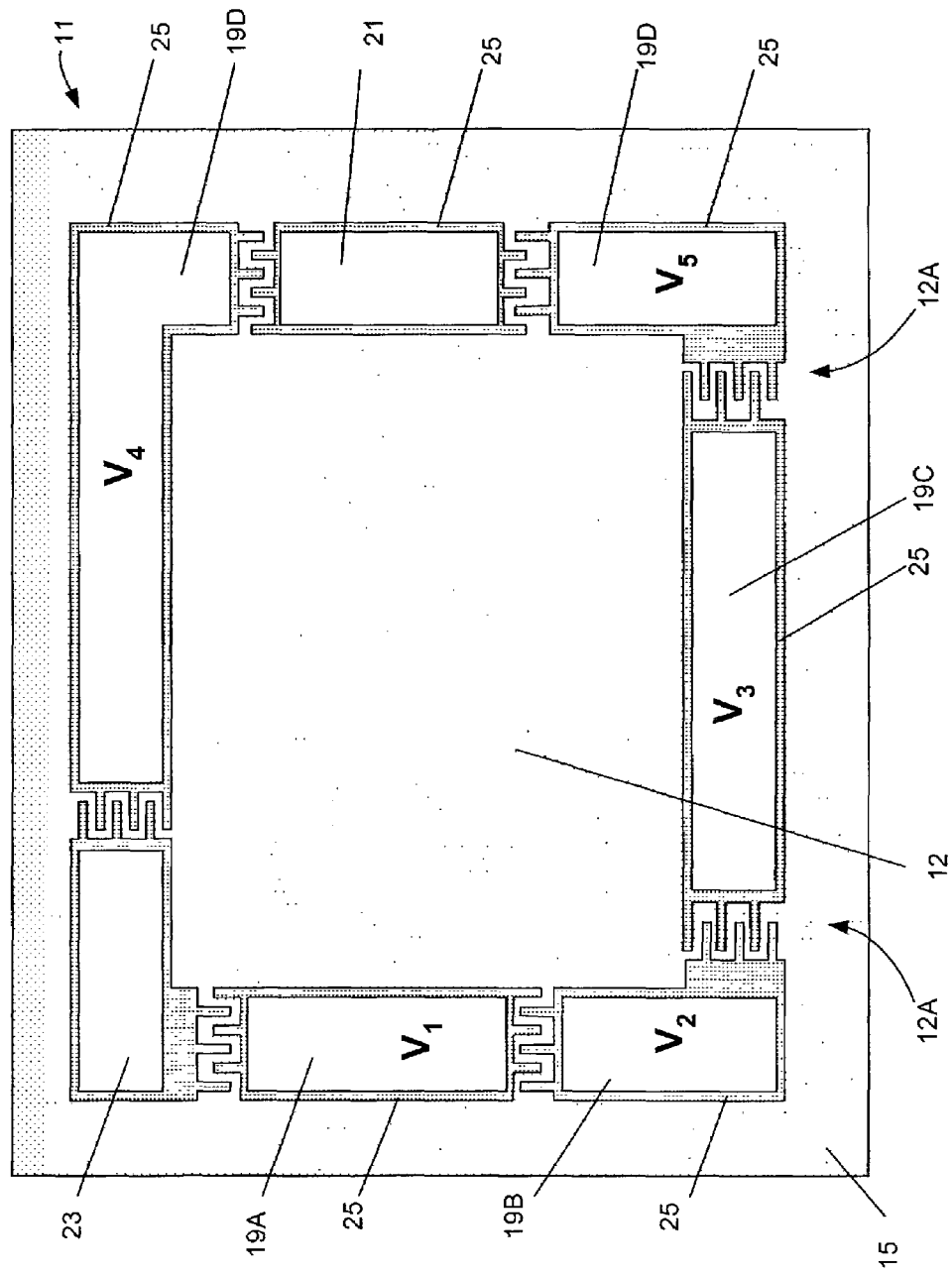
FIG. 2 is a schematic plan view of an illustrative power grid layout on an integrated circuit in accordance with one illustrative embodiment of the present invention.

FIG. 2 is a plan view of a power grid layout for an illustrative integrated circuit 11 in accordance with one embodiment of the present invention. In general, the circuits that comprise the integrated circuit 11 are formed in the core region 12 of the integrated circuit 11. Various power domains or voltage supply structures 19A–19E are positioned around the periphery of the chip 15. The voltage levels $V_1$–$V_5$ may all be at different levels. The power supply structures 19A–19E are typically comprised of one or more layers of metal, e.g., aluminum, formed above the substrate. A guard band 25 comprised of at least one doped region is formed in the substrate and positioned, at least partially, under each of the power supply structures 19A–19E. Each of the guard bands 25 is comprised of a plurality of fingers on each end of the guard band 25. The fingers are adapted to nest or mesh with corresponding fingers of a guard band 25 positioned under an adjacent voltage supply structure 19. The meshed or interdigitized fingers of the guard bands 25 positioned under adjacent power supply structures, e.g., structures 19A and 19B, serve to reduce or eliminate a path for undesirable triggering voltages and/or currents to enter the core region 12 of the integrated circuit. Compare the region 12A depicted in FIG. 2, comprised of the meshed fingers of the guard bands 25, with the openings or cuts 18A–C depicted in the prior art structure of FIG. 1A. In effect, the intermeshed fingers of the guard bands 25 provide a tortuous path that unwanted currents must pass before they can enter the core region 12 of the integrated circuit 11.

Also depicted in FIG. 2 are isolated regions 21, 23 formed on the periphery of the chip 15. In some cases, such isolated regions 21, 23 may contain the necessary circuitry to drive various input/output buffers. Thus, in some cases, the guard bands 25 of the present invention may be provided on such isolated regions 21, 23. In such cases, the guard bands 25 around the isolated regions 21, 23 may mesh or nest with the guard bands 25 of adjacent power supply regions.

Figure 3:
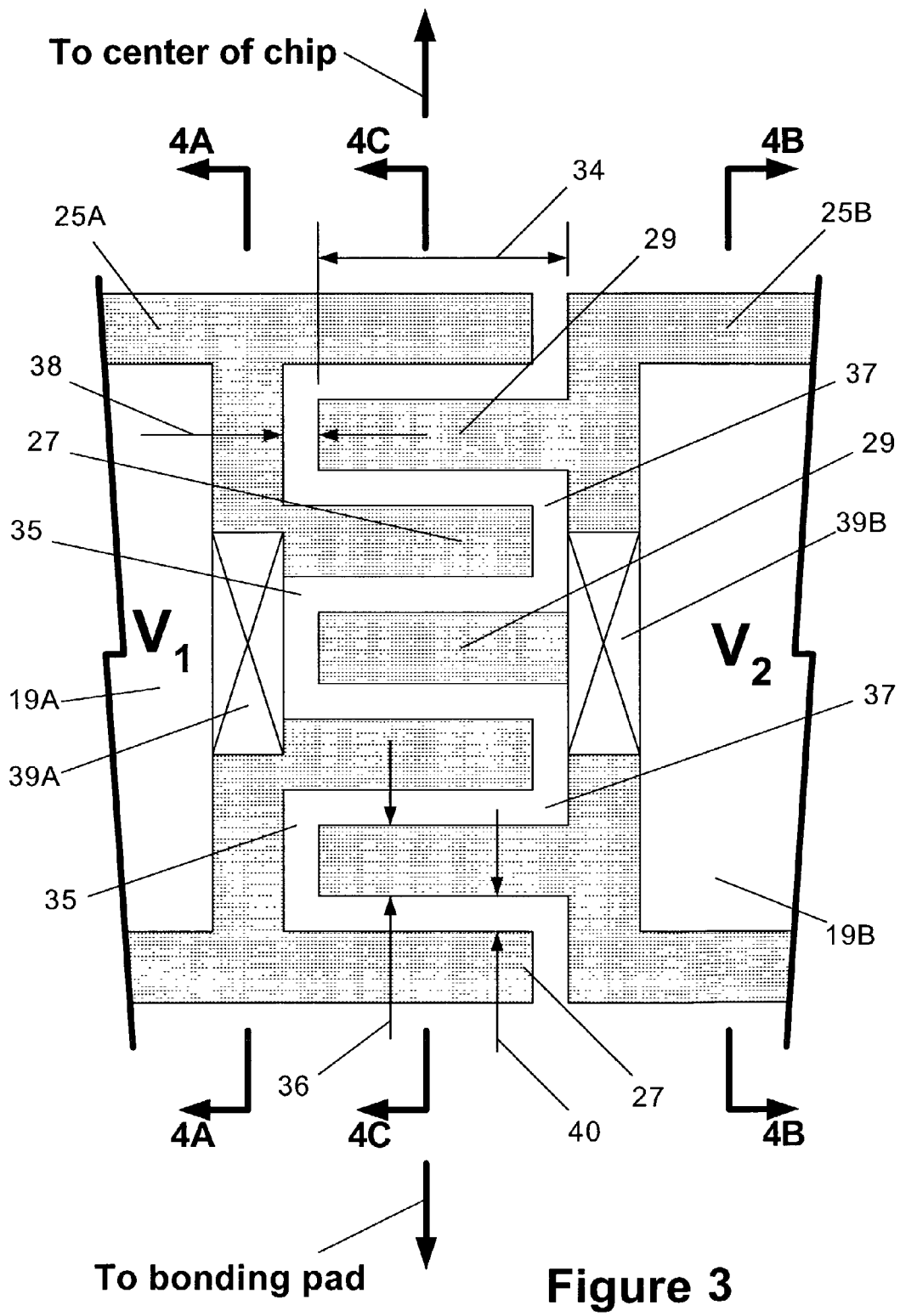
FIG. 3 is a plan view of the intersecting portions of a plurality of guard bands in accordance with one embodiment of the present invention.

FIG. 3 is a plan view of a portion of a first guard band 25A and a portion of a second guard band 25B. The first guard band 25A is positioned under a first voltage supply structure 19A ($V_1$), and the second guard band 25B is positioned under a second voltage supply structure 19B ($V_2$), wherein $V_1$ and $V_2$ may be of different magnitudes and/or polarity. As will be understood by those skilled in the art after a complete reading of the present application, only portions of the guard bands 25A, 25B are depicted. That is, the guard band 25A will normally be positioned under the entirety of the voltage supply structure 19A ($V_1$), although that is not depicted in FIG. 3. As described more fully below, the guard bands 25A, 25B are comprised of one or more doped regions that are formed in a semiconducting substrate 50 by performing known ion implantation processes.

Figure 4A:
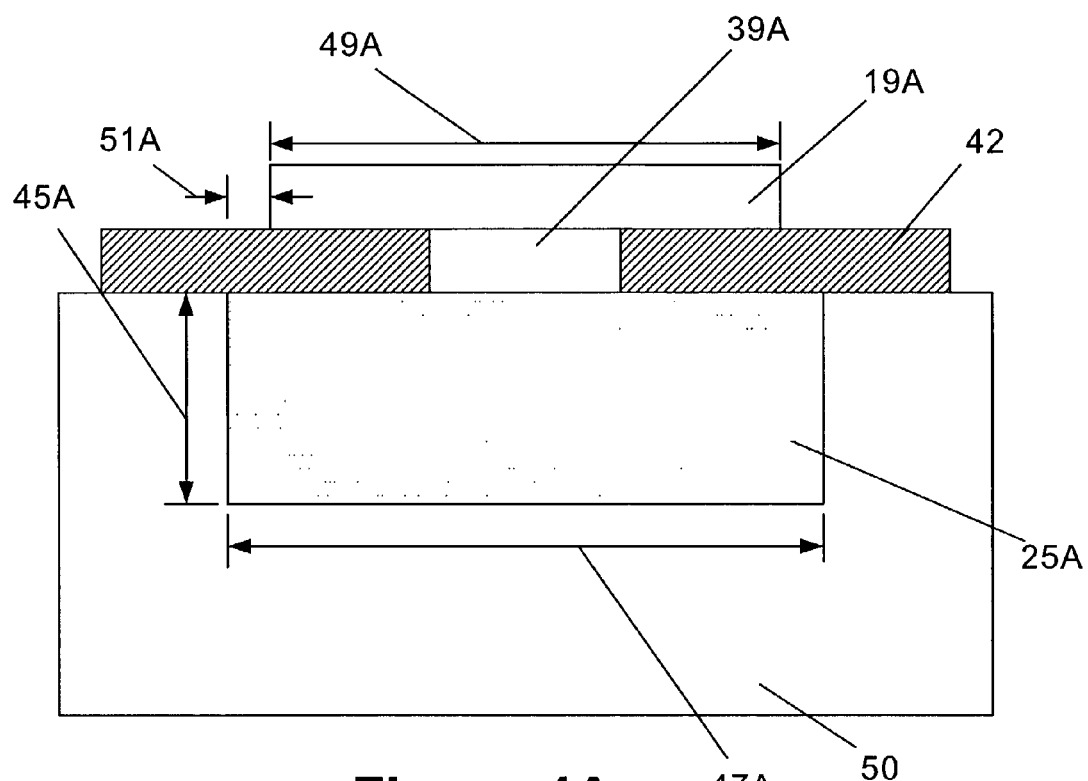
FIGS. 4A–4C are various cross-sectional views of one embodiment of the intermeshed fingers and the guard bands of one illustrative embodiment of the present invention.
Figure 4B:
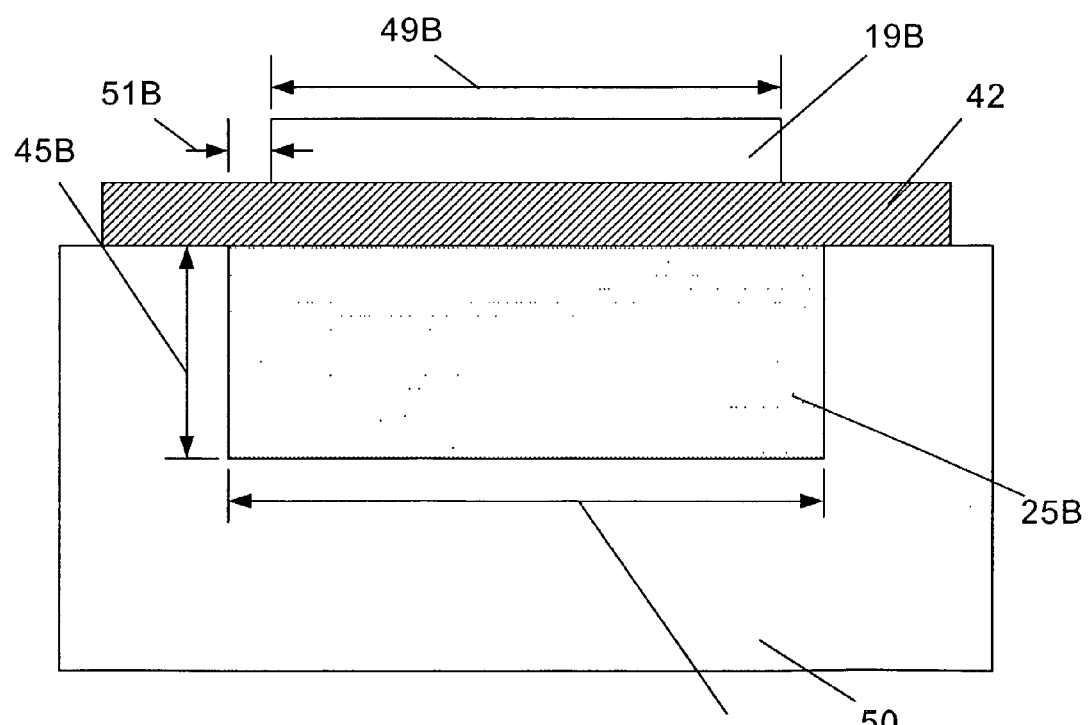

FIGS. 4A–4B are cross-sectional side views taken along the lines indicated in FIG. 3. As shown in FIG. 4A, a single doped region 25A is formed in the substrate 50 under the first voltage supply structure 19A. A contact 39A is provided to the doped region 25A such that a voltage may be applied to the doped region. A layer of insulating material, e.g., silicon dioxide, BPSG, etc., is positioned between the substrate 50 and the power supply structure 19A. The doped region 25A has a depth 45A and a width 47A that may vary depending upon the application. The size of the doped region 25A relative to the size of the voltage supply structure 19A may also vary depending upon the application. Typically, the width 47A of the doped region 25A will be wider than the width 49A of the voltage supply structure 19A. In one embodiment, the doped region 25A, as implanted, will extend by a distance 51 of approximately 0.2–2.0 µm beyond the voltage supply structure 19A. That is, in some embodiments, the doped region 25A is sized and configured such that the surface area defined by the doped region 25A is greater than the surface area defined by the voltage supply structure 19A, and the voltage support structure 19A is positioned above the doped region 25A within the area defined by the doped region 25A.

The type and species of dopant material implanted into the region 25A and the dopant concentration level for such region may vary depending upon the particular application. In one illustrative embodiment, the width 47A of the doped region 25A may vary from approximately 0.4–8.0 µm, the depth 45A of the doped region 25A may vary from approximately 0.05–5 µm and the distance 51 may be approximately 0.2–4.0 µm. Moreover, the doped region 25A may be implanted with an N-type dopant material, such as arsenic. This results in the doped region 25A having a dopant concentration level of approximately $5e^{19}$–$2e^{20}$ ions/cm$^3$.

FIG. 4B is a cross-sectional view of the doped region 25B positioned under the voltage supply structure 19B. The doped region 25B also has a depth 45B and a length 47B. The doped region 25B may extend beyond the width 49B of the voltage supply 19B by a distance 51B. The doped regions 25A and 25B may be symmetrical in nature in that they both may have the same or similar physical dimensions, e.g., the width 47A, 47B and depth 45A, 45B may be approximately the same. However, the present invention may be employed in situations where the physical dimensions and positioning of the doped regions 25A and 25B may be different from one another. Thus, the particular details depicted in the attached drawings should not be considered a limitation of the present invention unless such limitations are clearly set forth in the appended claims.

As shown in FIG. 3, each of the guard bands 25A, 25B has a plurality of fingers 27, 29, respectively, formed on an end of the guard bands 25A, 25B. The physical dimensions of the doped regions that define the guard bands 25A, 25B and the fingers 27, 29, and the spacing between the fingers 27, 29 may vary. As shown in FIG. 3, the fingers 27, 29 have a length 34 that ranges from approximately 5–30 µm, a width 36 that ranges from approximately 3–20 µm, an end spacing 38 that ranges from approximately 5–10 µm and a lateral spacing 40 that ranges from approximately 5–10 µm.

As depicted in FIG. 3, the fingers 27 of the first guard band 25A mesh or nest with the fingers 29 of the second guard band 25B. More particularly, the fingers 29 of the second guard band 25B are positioned within the recesses 35 formed between adjacent fingers 27 of the first guard band 25A. Similarly, the fingers 27 of the first guard band 25A are positioned within recesses 37 formed between adjacent fingers 29 of the second guard band 25B. Although the meshed or nested fingers 27, 29 in FIG. 3 are depicted in a symmetrical arrangement, after a complete reading of the present application those skilled in the art will understand that such symmetry is not required in all embodiments of the present invention. Moreover, the fingers 27, 29 need not have uniform physical characteristics, i.e., the number of fingers, the width 36, length 34 and/or spacing 38, 40 may be varied on each of the guard bands 25A, 25B as desired. Thus, the physical dimensions recited herein for the fingers 27, 29, the spacing between and positioning of such fingers 27, 29 should not be considered a limitation of the present invention unless such limitations are expressly recited in the appended claims.

Figure 4C:
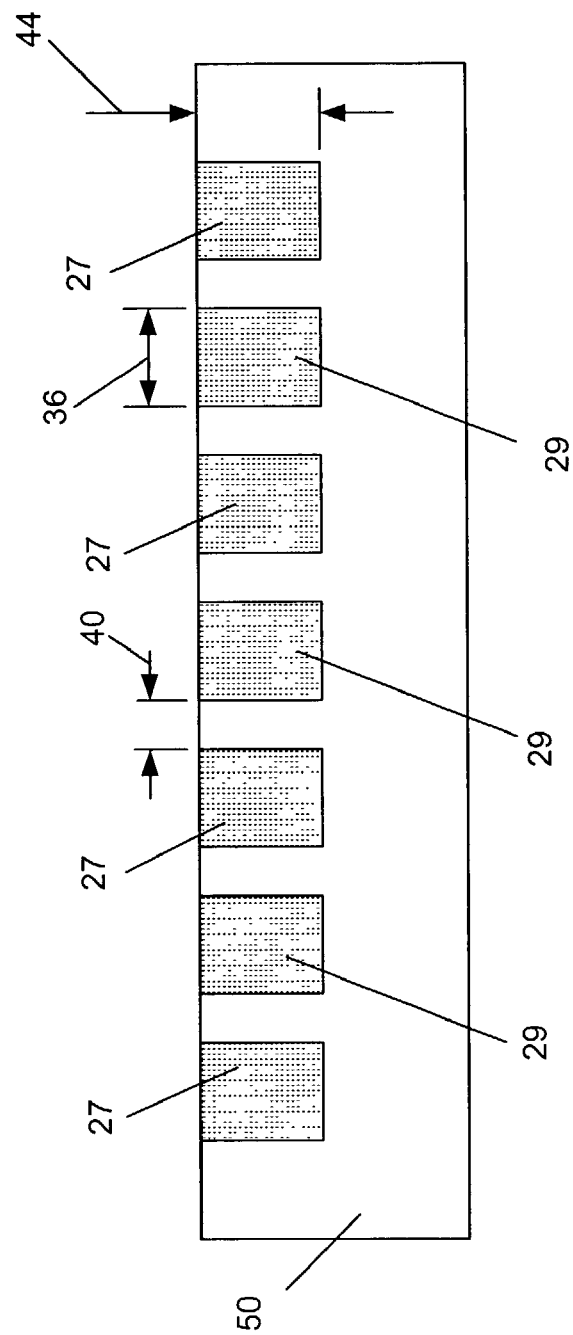

FIG. 4C is a cross-sectional view taken along the line 4C—4C in FIG. 3. As shown therein, in one illustrative embodiment, the fingers 27, 29 are comprised of doped regions formed in the semiconducting substrate 50. In one embodiment, the fingers 27, 29 have a depth 44 that ranges from approximately 0.05–5.0 µm. Although the fingers 27, 29 exhibit a rectangular cross-sectional configuration in FIG. 4C, the cross-sectional configuration of the fingers 27, 29 may vary.

In the embodiments described previously, the guard bands 25 are comprised of single doped regions (25A, 25B) formed in the substrate 50. The fingers 27, 29 are also comprised of single doped regions formed in the substrate. However, in further embodiments of the present invention, the guard bards 25 positioned under the voltage supply structures 19 may be comprised of multiple doped regions. These intermeshing fingers 27, 29 may also exhibit this multiple doped region configuration.

Figure 5:
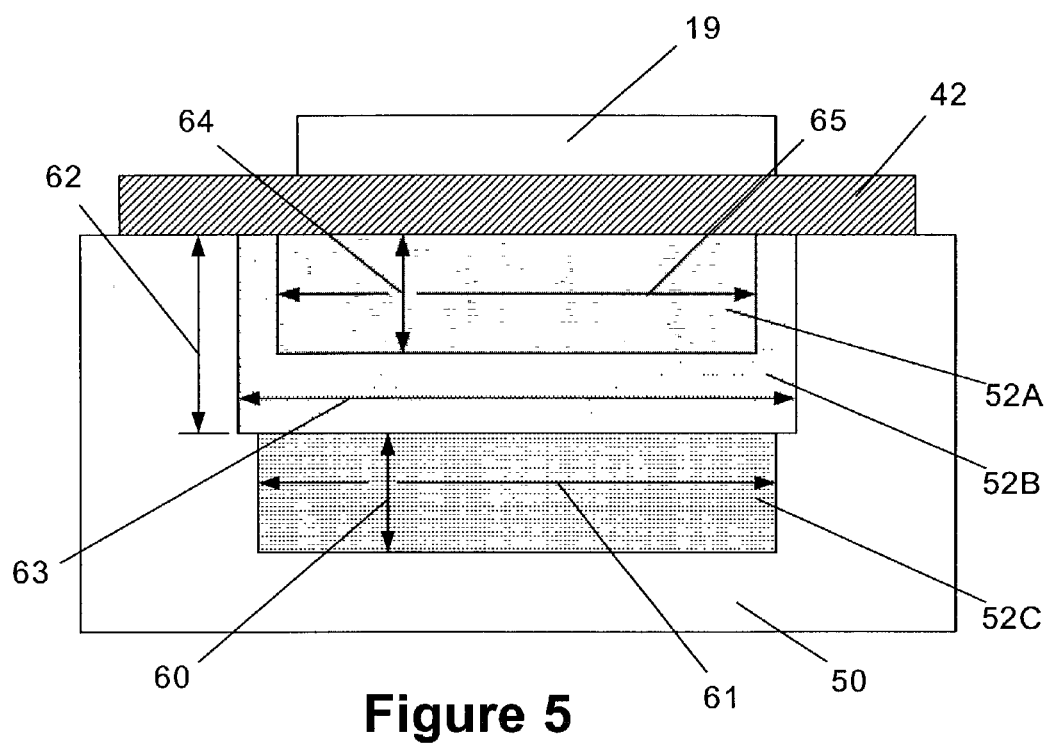
FIGS. 5 and 6 are cross-sectional views of another illustrative embodiment of the intermeshed fingers and guard bands of the present invention.

FIG. 5 is a cross-sectional view of an illustrative guard band 25 comprised of multiple doped regions 52A, 52B and 52C formed in the substrate 50 under the illustrative voltage supply structure 19 that is separated from the substrate 50 by the insulating layer 42. As will be recognized by those skilled in the art after a complete reading of the present application, the size and doping levels of the illustrative doped regions 52A, 52B and 52C may vary depending upon the particular application. The number of doped regions and their configuration may also vary.

For example, in one illustrative embodiment, the doped region 52A is an N$^+$ active region having a dopant concentration level of approximately $5e^{19}$–$2e^{20}$ ions/cm$^3$, the doped region 52B is an N-well region having a dopant concentration level of approximately $2e^{16}$–$8e^{17}$ ions/cm$^3$, and the doped region 52C is a deep (buried) N-well having a dopant concentration of approximately $2e^{16}$–$8e^{17}$ ions/cm$^3$. The doped regions 52A, 52B, 52C may vary in size and configuration. In one illustrative embodiment, the doped region 52A has a depth 64 of approximately 0.05–5.0 µm and a width 65 of approximately 0.3–8.0 µm. The doped region 52B has a depth 62 of approximately 1–5 µm and a width 63 of approximately 1–10 µm. The doped region 52C may have a depth 60 of approximately 0.5–3.0 µm and a width 61 of approximately 0.8–10.0 µm. Of course, these representative dimensions are provided by way of example only.

Figure 6:
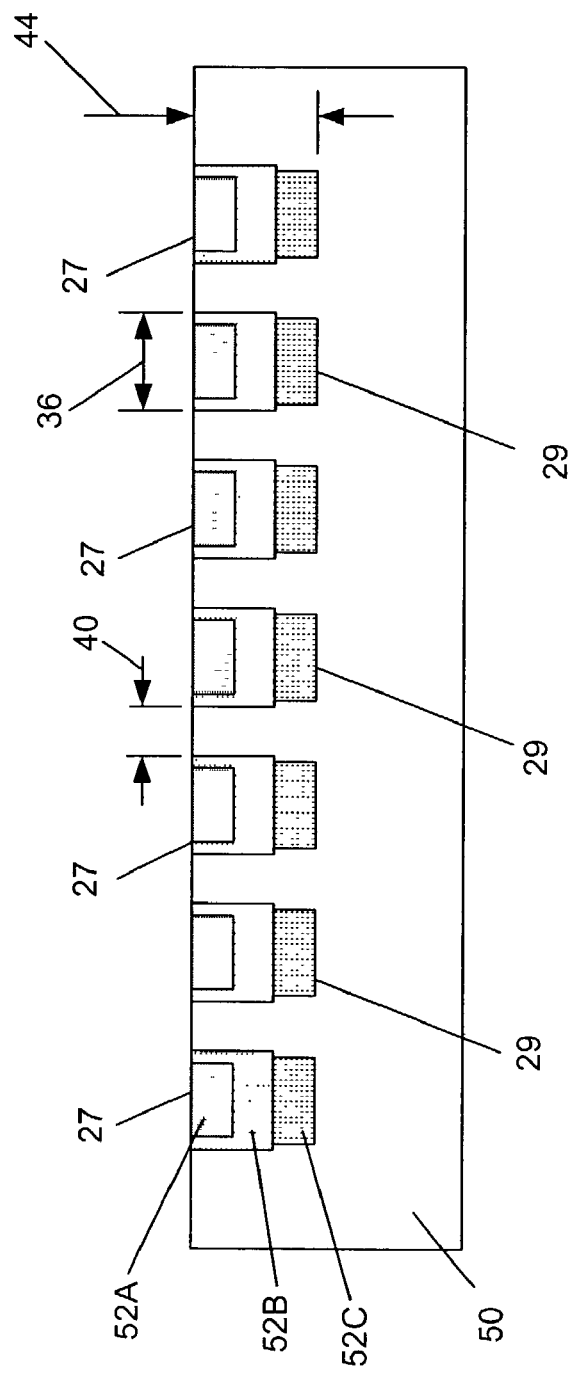

In the situation where the guard bands 25 are comprised of multiple doped regions, like the doped regions 52A, 52B and 52C depicted in FIG. 5, the intermeshing fingers 27, 29 of adjacent guard bands 25A, 25B may also exhibit such a multiple doped region configuration. FIG. 6 is a cross-sectional view depicting such an illustrative configuration. As shown therein, the fingers 27, 29 are comprised of corresponding doped regions 52A, 52B and 52C similar to that depicted in FIG. 5. However, the physical dimensions of the doped regions that comprise these fingers 27, 29 would be scaled down to fit within the overall width 36 and depth 44 of the fingers 27, 29. However, it should be understood that the number of doped regions that comprise the fingers 27, 29 need not necessarily correspond to the number of doped regions used to form the bulk of doped regions positioned under the voltage supplies 19. For example, the main portion of the guard bands 25 may be comprised of multiple doped regions 52A, 52B and 52C while the fingers 27, 29 are only comprised of a single doped region, e.g., an extension of the doped region 52B only.

In general, the guard bands 25 that are positioned under the power domain structures are formed by performing known ion implantation processes using appropriate masking layers. The implant steps used to form the guard bands 25 may be performed at any time that is convenient during the process flow used to form the integrated circuit product. Typically, the guard bands 25 may be implanted with a dopant material, such as arsenic or phosphorous, and the resulting guard bands 25 may have a dopant concentration level of approximately $2e^{19}$–$4e^{20}$ ions/cm$^3$. The implant dose and energy level used during the ion implant process may vary depending upon the type of dopant material implanted and the desired depth 44 of the guard bands 25.

The present invention is generally directed to intermeshed guard bands for multiple voltage supply regions or structures on an integrated circuit, and methods of making same. In one illustrative embodiment, an integrated circuit is provided that comprises a plurality of voltage supply structures 19 formed above the substrate 50, the plurality of voltage supply structures 19 being at differing voltage levels, and a guard band 25 comprised of at least one doped region formed in the substrate 50 under each of the plurality of voltage supply structures 19, each of the guard bands 25 being comprised of a plurality of fingers extending from each end of the guard bands 25. In further embodiments, the guard band 25 is comprised of a plurality of doped regions 52A, 52B and 52C.

In another illustrative embodiment, an integrated circuit is provided that comprises a plurality of voltage supply structures 19 formed above the substrate 50, the plurality of voltage supply structures 19 being at differing voltage levels, and a guard band 25 comprised of at least one doped region formed in the substrate 50 under each of the voltage supply structures 19, each of the guard bands 25 being comprised of a plurality of fingers extending from each end of the guard bands, wherein the plurality of fingers on a first of the guard bands nests with the plurality of fingers on a second guard band positioned proximate the first guard band. In further embodiments, the guard bands may also be comprised of a plurality of doped regions formed in the substrate.

The present invention is also directed to a novel method. In one illustrative embodiment, the method comprises forming a masking layer above a substrate wherein the masking layer defines an exposed region of the substrate in which a guard band having a plurality of fingers on each end of the guard band will be formed. The method further comprises performing at least one ion implantation process to implant dopant atoms into said substrate to thereby define the guard band in the substrate.

Through use of the present invention, the occurrences of latch-up in integrated circuits may be prevented or the number of such occurrences may be reduced. As a result, device reliability and performance may be improved. Similarly, modern devices incorporating such features may function more reliably and for a longer duration as compared to such devices made using integrated circuits comprised of the prior art structures described in the background section of the application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit, comprising:
   a plurality of voltage supply structures formed above a substrate, said plurality of voltage supply structures being at differing voltage levels; and
   a guard band comprised of a plurality of doped regions formed in said substrate under each of said plurality of voltage supply structures, each of said guard bands comprised of a plurality of fingers extending from each end of said guard bands.

2. The integrated circuit of claim 1, wherein said guard bands are comprised of a plurality of N-doped regions formed in said substrate.

3. The integrated circuit of claim 2, wherein at least one of said plurality of N-doped regions is doped at a concentration level ranging from approximately $2e^{16}$–$8e^{17}$ ions/cm$^3$.

4. The integrated circuit of claim 1, wherein each of said fingers has a length ranging from approximately 5–30 μm.

5. The integrated circuit of claim 1, wherein each of said fingers has a width that ranges from approximately 3–20 μm.

6. The integrated circuit of claim 1, wherein each of said fingers has a depth that ranges from approximately 0.05–5.0 μm.

7. The integrated circuit of claim 1, wherein each of said fingers has a generally rectangular cross-sectional configuration.

8. The integrated circuit of claim 1, wherein said integrated circuit is at least one of a memory device, a logic device, a microprocessor and an application-specific integrated circuit.

9. The integrated circuit of claim 1, wherein said guard band has a width dimension and said voltage supply structure has a width dimension, the width of said guard band being greater than the width of said voltage supply structure.

10. The integrated circuit of claim 1, wherein each of said plurality of fingers are comprised of a plurality of doped regions formed in said substrate.

11. The integrated circuit of claim 1, wherein each of said plurality of fingers is comprised of a single doped region formed in said substrate.

12. The integrated circuit device of claim 1, wherein said guard band is comprised of three doped regions formed in said substrate.

13. An integrated circuit, comprising:
   a plurality of voltage supply structures formed above a substrate, said plurality of voltage supply structures being at differing voltage levels; and a guard band comprised of a plurality of doped regions formed in said substrate under each of said plurality of voltage supply structures, each of said guard bands comprised of a plurality of fingers extending from each end of said guard bands.

14. The integrated circuit of claim 13, wherein said guard bands are comprised of a plurality of N-doped regions formed in said substrate.

15. The integrated circuit of claim 14, wherein at least one of said plurality of N-doped regions is doped at a concentration level ranging from approximately $2e^{16}$–$8e^{17}$ ions/cm$^3$.

16. The integrated circuit of claim 13, wherein each of said fingers has a length ranging from approximately 5–30 μm.

17. The integrated circuit of claim 13, wherein each of said fingers has a width that ranges from approximately 3–20 μm.

18. The integrated circuit of claim 13, wherein each of said fingers has a depth that ranges from approximately 0.05–5.0 μm.

19. The integrated circuit of claim 13, wherein each of said fingers has a generally rectangular cross-sectional configuration.

20. The integrated circuit of claim 13, wherein said integrated circuit is at least one of a memory device, a logic device, a microprocessor and an application-specific integrated circuit.

21. The integrated circuit of claim 13, wherein said guard band has a width dimension and said voltage supply structure has a width dimension, the width of said guard band being greater than the width of said voltage supply structure.

22. The integrated circuit of claim 13, wherein each of said plurality of fingers are comprised of a plurality of doped regions formed in said substrate.

23. The integrated circuit of claim 13, wherein each of said plurality of fingers is comprised of a single doped region formed in said substrate.

24. The integrated circuit device of claim 13, wherein said guard band is comprised of three doped regions formed in said substrate.

25. An integrated circuit, comprising:
a plurality of voltage supply structures formed above a substrate, said plurality of voltage supply structures being at differing voltage levels; and
a guard band comprised of at least one doped region formed in said substrate under each of said voltage supply structures, each of said guard bands comprised of a plurality of fingers extending from each end of said guard bands, wherein said plurality of fingers on a first of said guard bands nests with said plurality of fingers on a second guard band positioned proximate said first guard band.

26. The integrated circuit of claim 25, wherein said guard bands are comprised of at least one N-doped region formed in said substrate.

27. The integrated circuit of claim 26, wherein said at least one N-doped region is doped at a concentration level ranging from approximately $2e^{16}$–$8e^{17}$ ions/cm$^3$.

28. The integrated circuit of claim 25, wherein each of said fingers has a length ranging from approximately 5–30 μm.

29. The integrated circuit of claim 25, wherein each of said fingers has a width that ranges from approximately 3–20 μm.

30. The integrated circuit of claim 25, wherein each of said fingers has a depth that ranges from approximately 0.05–5.0 μm.

31. The integrated circuit of claim 25, wherein each of said fingers has a generally rectangular cross-sectional configuration.

32. The integrated circuit of claim 25, wherein said integrated circuit is comprised of at least one of a memory device, a logic device, a microprocessor and an application-specific integrated circuit.

33. The integrated circuit of claim 25, wherein said guard band has a width dimension and said voltage supply structure has a width dimension, the width of said guard band being greater than the width of said voltage supply structure.

34. The integrated circuit of claim 25, wherein said guard band is comprised of a plurality of doped regions formed in said substrate.

35. The integrated circuit of claim 25, wherein said guard band is comprised of a single doped region formed in said substrate.

36. The integrated circuit of claim 25, wherein said guard band and each of said plurality of fingers are comprised of a single doped region formed in said substrate.

37. The integrated circuit of claim 25, wherein said guard band and said plurality of fingers are comprised of a plurality of doped regions formed in said substrate.

38. The integrated circuit of claim 34, wherein each of said plurality of fingers is comprised of a single doped region formed in said substrate.

39. The integrated circuit device of claim 25, wherein said guard band is comprised of three doped regions formed in said substrate.

40. An integrated circuit, comprising:
a plurality of voltage supply structures formed above a substrate, said plurality of voltage supply structures being at differing voltage levels; and
a guard band comprised of a plurality of doped regions formed in said substrate under each of said voltage supply structures, each of said guard bands comprised of a plurality of fingers extending from each end of said guard bands, wherein said plurality of fingers on a first of said guard bands nests with said plurality of fingers on a second guard band positioned proximate said first guard band.

41. The integrated circuit of claim 40, wherein said guard bands are comprised of a plurality of N-doped regions formed in said substrate.

42. The integrated circuit of claim 41, wherein at least one of said plurality of N-doped regions is doped at a concentration level ranging from approximately $2e^{16}$–$8e^{17}$ ions/cm$^3$.

43. The integrated circuit of claim 40, wherein each of said fingers has a length ranging from approximately 5–30 μm.

44. The integrated circuit of claim 40, wherein each of said fingers has a width that ranges from approximately 3–20 μm.

45. The integrated circuit of claim 40, wherein each of said fingers has a depth that ranges from approximately 0.05–5.0 μm.

46. The integrated circuit of claim 40, wherein each of said fingers has a generally rectangular cross-sectional configuration.

47. The integrated circuit of claim 40, wherein said integrated circuit is comprised of at least one of a memory device, a logic device, a microprocessor and an application-specific integrated circuit.

48. The integrated circuit of claim 40, wherein said guard band has a width dimension and said voltage supply structure has a width dimension, the width of said guard band being greater than the width of said voltage supply structure.

49. The integrated circuit of claim 40, wherein each of said plurality of fingers is comprised of a plurality of doped regions formed in said substrate.

50. The integrated circuit of claim 40, wherein each of said plurality of fingers is comprised of a single doped region formed in said substrate.

51. The integrated circuit device of claim 40, wherein said guard band is comprised of three doped regions formed in said substrate.

52. An integrated circuit, comprising:
a plurality of voltage supply structures formed above a substrate, said plurality of voltage supply regions being at differing voltage levels; and
a guard band comprised of at least one doped region formed in said substrate under each of said voltage supply regions, each of said guard bands comprised of a plurality of fingers extending from each end of said guard bands, wherein said plurality of fingers on a first of said guard bands are positioned within recesses defined by said plurality of fingers on a second guard band positioned proximate said first guard band.

53. The integrated circuit of claim 52, wherein said guard bands are comprised of at least one N-doped region formed in said substrate.

54. The integrated circuit of claim 53, wherein said at least one N-doped region is doped at a concentration level ranging from approximately $2e^{16}$–$8e^{17}$ ions/cm$^3$.

55. The integrated circuit of claim 52, wherein each of said fingers has a length ranging from approximately 5–30 µm.

56. The integrated circuit of claim 52, wherein each of said fingers has a width that ranges from approximately 3–20 µm.

57. The integrated circuit of claim 52, wherein each of said fingers has a depth that ranges from approximately 0.05–5.0 µm.

58. The integrated circuit of claim 52, wherein each of said fingers has a generally rectangular cross-sectional configuration.

59. The integrated circuit of claim 52, wherein said integrated circuit is comprised of at least one of a memory device, a logic device, a microprocessor and an application-specific integrated circuit.

60. The integrated circuit of claim 52, wherein said guard band has a width dimension and said voltage supply structure has a width dimension, the width of said guard band being greater than the width of said voltage supply structure.

61. The integrated circuit of claim 52, wherein said guard band is comprised of a plurality of doped regions formed in said substrate.

62. The integrated circuit of claim 52, wherein said guard band is comprised of a single doped region formed in said substrate.

63. The integrated circuit of claim 52, wherein said guard band and each of said plurality of fingers are comprised of a single doped region formed in said substrate.

64. The integrated circuit of claim 52, wherein said guard band and said plurality of fingers are comprised of a plurality of doped regions formed in said substrate.

65. The integrated circuit of claim 61, wherein each of said plurality of fingers is comprised of a single doped region formed in said substrate.

66. The integrated circuit device of claim 52, wherein said guard band is comprised of three doped regions formed in said substrate.

67. An integrated circuit, comprising:
a plurality of voltage supply structures formed above a substrate, said plurality of voltage supply regions being at differing voltage levels; and
a guard band comprised of a plurality of doped regions formed in said substrate under each of said voltage supply regions, each of said guard bands comprised of a plurality of fingers extending from each end of said guard bands, wherein said plurality of fingers on a first of said guard bands are positioned within recesses defined by said plurality of fingers on a second guard band positioned proximate said first guard band.

68. The integrated circuit of claim 67, wherein said guard bands are comprised of a plurality of N-doped regions formed in said substrate.

69. The integrated circuit of claim 68, wherein at least one of said N-doped regions is doped at a concentration level ranging from approximately $2e^{16}$–$8e^{17}$ ions/cm$^3$.

70. The integrated circuit of claim 67, wherein each of said fingers has a length ranging from approximately 5–30 µm.

71. The integrated circuit of claim 67, wherein each of said fingers has a width that ranges from approximately 3–20 µm.

72. The integrated circuit of claim 67, wherein each of said fingers has a depth that ranges from approximately 0.05–5.0 µm.

73. The integrated circuit of claim 67, wherein each of said fingers has a generally rectangular cross-sectional configuration.

74. The integrated circuit of claim 67, wherein said integrated circuit is comprised of at least one of a memory device, a logic device, a microprocessor and an application-specific integrated circuit.

75. The integrated circuit of claim 67, wherein said guard band has a width dimension and said voltage supply structure has a width dimension, the width of said guard band being greater than the width of said voltage supply structure.

76. The integrated circuit of claim 67, wherein each of said plurality of fingers is comprised of a plurality of doped regions formed in said substrate.

77. The integrated circuit of claim 67, wherein each of said plurality of fingers is comprised of a single doped region formed in said substrate.

78. The integrated circuit device of claim 67, wherein said guard band is comprised of three doped regions formed in said substrate.

79. An integrated circuit, comprising:
a plurality of voltage supply structures formed above a substrate, said plurality of voltage supply structures being at differing voltage levels; and
a guard band comprised of at least one doped region formed in said substrate under each of said plurality of voltage supply structures, each of said guard bands comprised of a plurality of fingers extending from each end of said guard bands, wherein said guard band and said plurality of fingers are comprised of a plurality of doped regions formed in said substrate.

80. The integrated circuit of claim 79, wherein each of said fingers has a generally rectangular cross-sectional configuration.

81. The integrated circuit of claim 79, wherein said integrated circuit is at least one of a memory device, a logic device, a microprocessor and an application-specific integrated circuit.

82. The integrated circuit of claim 79, wherein said guard band has a width dimension and said voltage supply structure has a width dimension, the width of said guard band being greater than the width of said voltage supply structure.

83. The integrated circuit device of claim 79, wherein said guard band is comprised of three doped regions formed in said substrate.

* * * * *